(12) United States Patent
Suzuki et al.

(10) Patent No.: US 7,545,186 B2
(45) Date of Patent: Jun. 9, 2009

(54) RESET CIRCUIT

(75) Inventors: Hideaki Suzuki, Kawasaki (JP);
Hirokazu Yamazaki, Kawasaki (JP)

(73) Assignee: Fujitsu Microelectroncis Limited, Tokyo (JP)

( * ) Notice: Subject to any disclaimer, the term of this patent is extended or adjusted under 35 U.S.C. 154(b) by 0 days.

(21) Appl. No.: 10/998,060

(22) Filed: Nov. 29, 2004

(65) Prior Publication Data

US 2005/0275437 A1    Dec. 15, 2005

(30) Foreign Application Priority Data

Jun. 15, 2004    (JP)    ............... 2004-177099

(51) Int. Cl.
*H02H 3/24*    (2006.01)
(52) U.S. Cl. ................. 327/143; 327/198
(58) Field of Classification Search ................. 327/142, 327/143, 198
See application file for complete search history.

(56) References Cited

U.S. PATENT DOCUMENTS

| | | | | |
|---|---|---|---|---|
| 4,446,381 A | * | 5/1984 | Dalrymple | 327/143 |
| 5,212,412 A | * | 5/1993 | Atriss et al. | 327/143 |
| 5,497,112 A | * | 3/1996 | Hoang | 327/143 |
| 5,831,460 A | * | 11/1998 | Zhou | 327/143 |
| 5,917,255 A | * | 6/1999 | Ciccone | 307/130 |
| 5,959,476 A | * | 9/1999 | Pascucci | 327/143 |
| 6,118,315 A | * | 9/2000 | Guedj | 327/143 |
| 6,204,703 B1 | * | 3/2001 | Kwon | 327/143 |
| 6,538,482 B2 | * | 3/2003 | Hirano et al. | 327/143 |
| 6,812,777 B2 | * | 11/2004 | Tamura et al. | 327/540 |
| 7,425,854 B2 | * | 9/2008 | Suzuki | 327/198 |
| 2003/0223271 A1 | * | 12/2003 | Byeon et al. | 365/185.18 |
| 2004/0036514 A1 | * | 2/2004 | Kwon | 327/143 |
| 2005/0063710 A1 | * | 3/2005 | Ohsawa et al. | 398/182 |

FOREIGN PATENT DOCUMENTS

JP    05183416 A    7/1993

* cited by examiner

*Primary Examiner*—Lincoln Donovan
*Assistant Examiner*—Thomas J Hiltunen
(74) *Attorney, Agent, or Firm*—Arent Fox LLP

(57) ABSTRACT

A reset circuit includes a power supply detection circuit, a power-down detection circuit, and an output circuit. The power supply detection circuit outputs a first signal when a first voltage according to a power supply voltage is higher than a first threshold and outputting a second signal when the first voltage is lower than the first threshold during power-on and power-down. The power-down detection circuit outputs a third signal when a second voltage according to the power supply voltage becomes lower than a second threshold after the second signal is outputted during power-down. The output circuit outputs a power-on reset signal which changes from low to high when the first signal is outputted during power-on and outputs a power-down reset signal which changes from low to high when the third signal is outputted during power-down.

25 Claims, 15 Drawing Sheets

F I G. 6
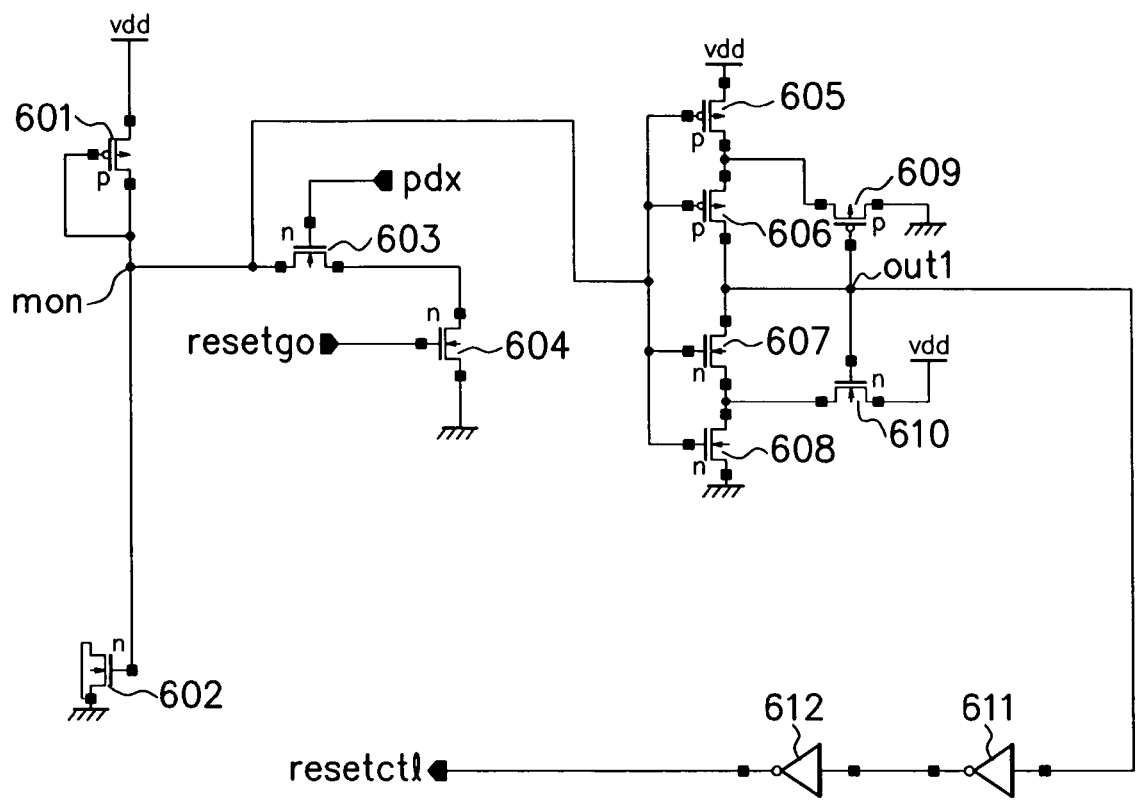

F I G. 8
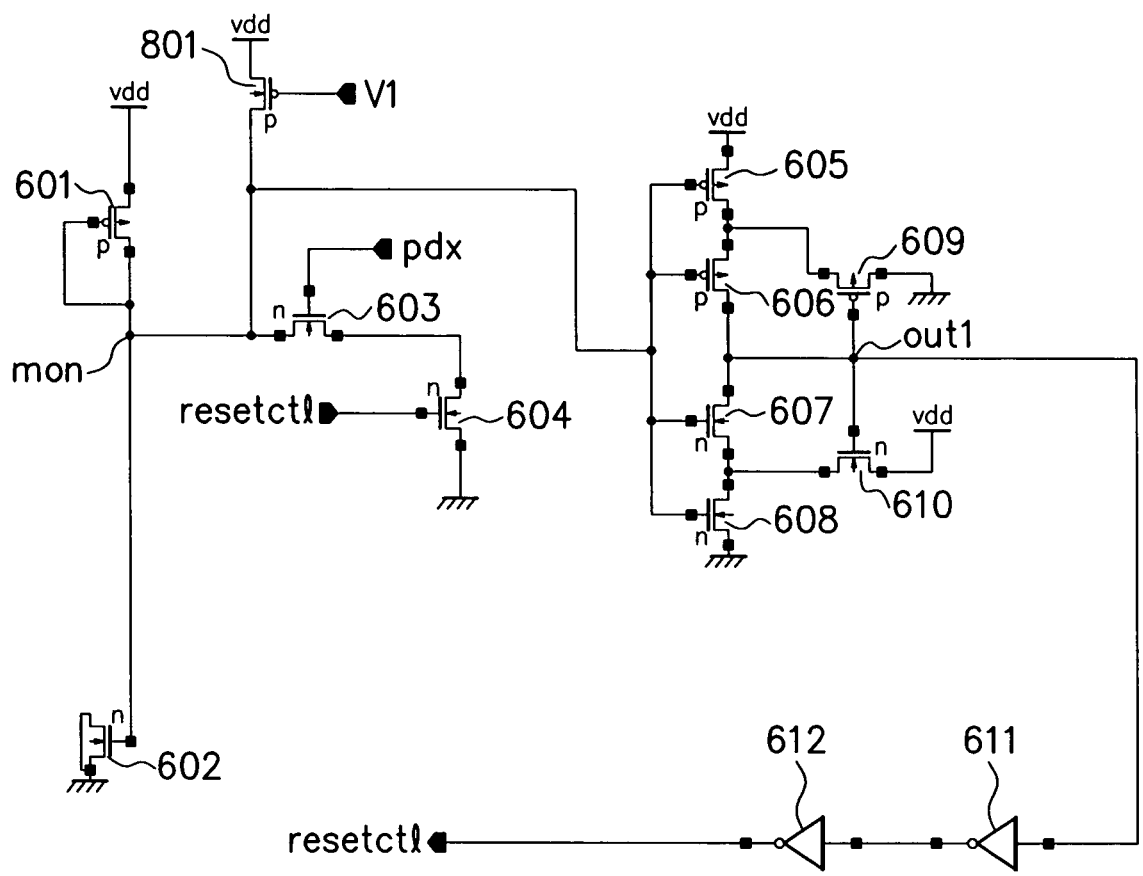

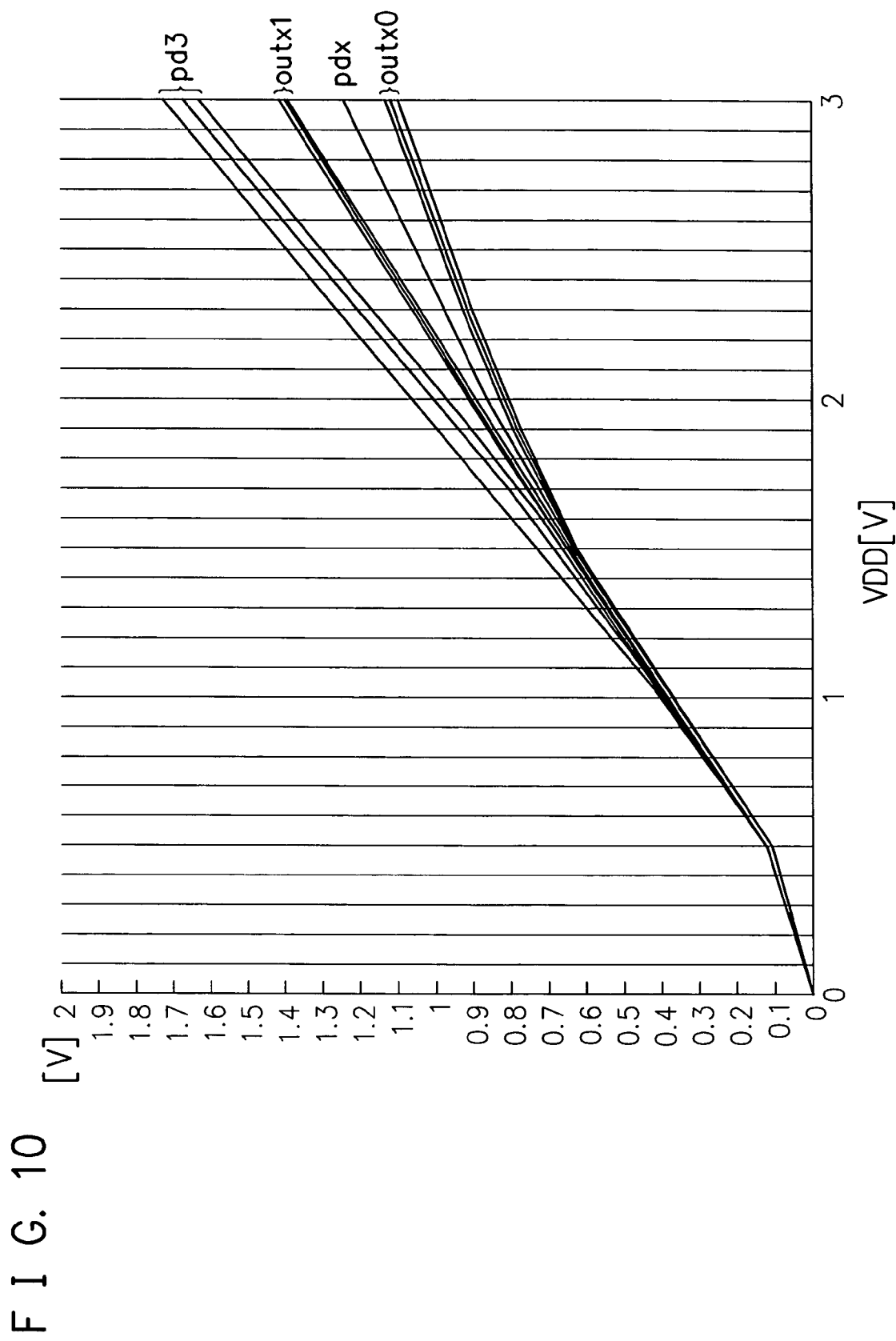
F I G. 10

RESET CIRCUIT

CROSS-REFERENCE TO RELATED APPLICATIONS

This application is based upon and claims the benefit of priority from the prior Japanese Patent Application No. 2004-177099, filed on Jun. 15, 2004, the entire contents of which are incorporated herein by reference.

BACKGROUND OF THE INVENTION

1. Field of the Invention

The present invention relates to a reset circuit, and particularly relates to a reset circuit which outputs a power-on reset signal and a power-down reset signal.

2. Description of the Related Art

A power-on reset circuit generates a power-on reset signal to perform a reset during power-on. A power-down reset circuit generates a power-down reset signal to perform a reset during power-down. If the power-on reset circuit and the power-down reset circuit are formed by separate circuits, the circuit area thereof becomes larger. Moreover, it is difficult to control the timing when the power-down reset signal occurs during power-down.

Further, a power-on reset circuit having a hysteresis characteristic is disclosed in the following Patent Document 1.

(Patent Document 1)

Japanese Patent Application Laid-open No. Hei 5-183416

SUMMARY OF THE INVENTION

An object of the present invention is to provide a small-sized reset circuit capable of outputting a power-on reset signal and a power-down reset signal.

Another object of the present invention is to facilitate the timing control of the power-down reset signal during power-down to prevent a poor startup when the power is repeatedly turned on/off.

A reset circuit includes a power supply detection circuit, a power-down detection circuit, and an output circuit. The power supply detection circuit outputs a first signal when a first voltage according to a power supply voltage is higher than a first threshold and outputting a second signal when the first voltage is lower than the first threshold during power-on and power-down. The power-down detection circuit outputs a third signal when a second voltage according to the power supply voltage becomes lower than a second threshold after the second signal is outputted during power-down. The output circuit outputs a power-on reset signal which changes from low to high when the first signal is outputted during power-on and outputs a power-down reset signal which changes from low to high when the third signal is outputted during power-down.

BRIEF DESCRIPTION OF THE DRAWINGS

FIG. 6 is a circuit diagram showing a configuration example of a power-down detection circuit;

FIG. 8 is a circuit diagram showing a configuration example of another power-down detection circuit;

FIG. 10 is a graph showing reference voltages;

DETAILED DESCRIPTION OF THE PREFERRED EMBODIMENTS

Figure 1:
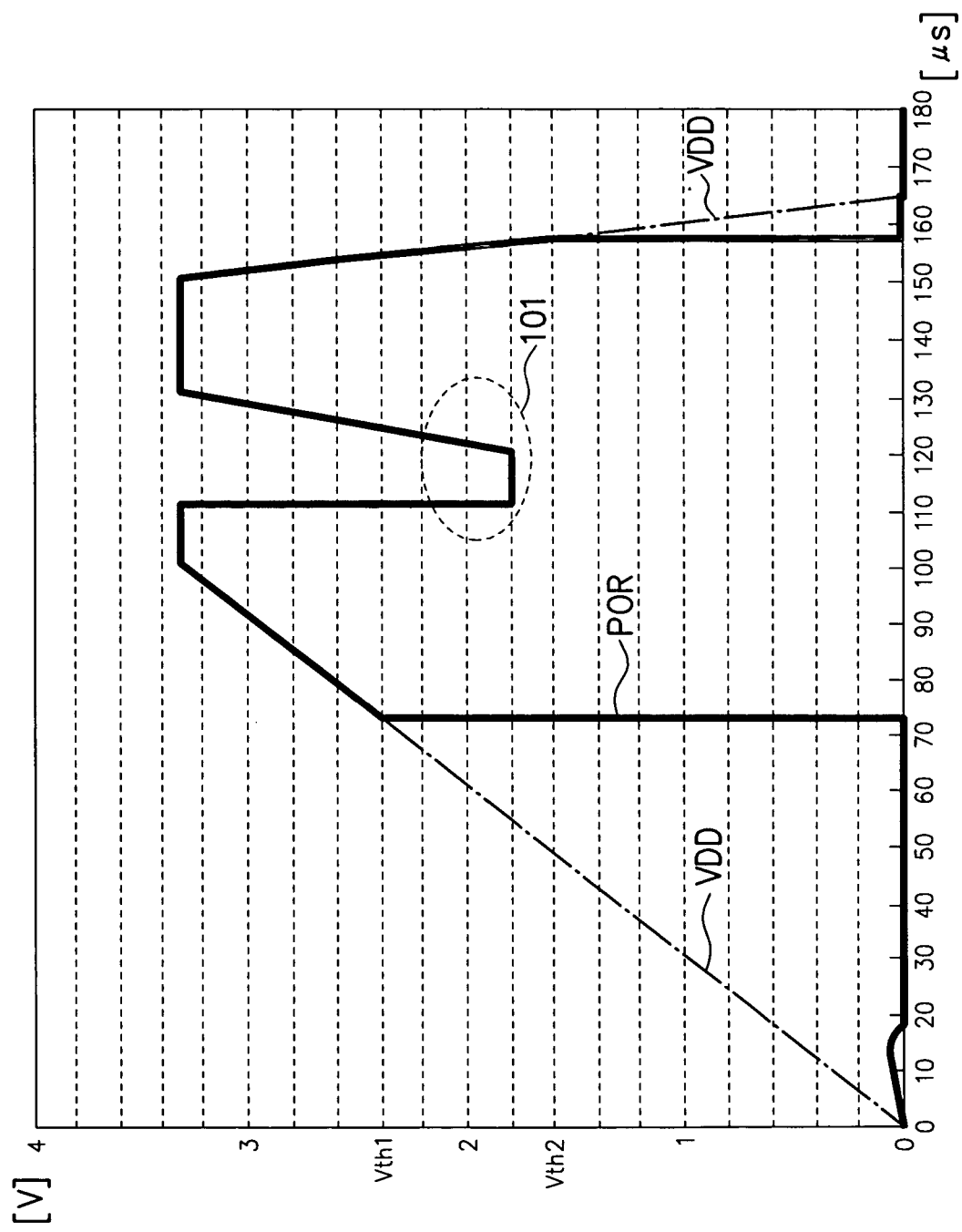
FIG. 1 is a waveform chart showing an example of a reset signal POR generated by a reset circuit according to an embodiment of the present invention.

FIG. 1 is a waveform chart showing an example of a reset signal POR generated by a reset circuit according to an embodiment of the present invention. The horizontal axis shows time after power-on (the power is turned on), and the vertical axis shows voltage. A power supply voltage VDD gradually rises from 0 V to 3.3 V after power-on, and drops from 3.3 V to 0 V after power-down (the power is turned off). During power-on, the reset signal POR shows a power-on reset signal which becomes low (0 V) when the power supply voltage VDD is lower than a threshold Vth1 and becomes high (power supply voltage VDD) when the power supply voltage VDD is higher than the threshold Vth1. On the other hand, during power-down, the reset signal POR shows a power-down reset signal which becomes high (power supply voltage VDD) when the power supply voltage VDD is higher than a threshold Vth2 and becomes low (0 V) when the power supply voltage VDD is lower than the threshold Vth2.

The power supply voltage threshold Vth2 at which the power-down reset signal occurs is lower than the power supply voltage threshold Vth1 at which the power-on reset signal occurs. Namely, a hysteresis characteristic that both threshold values are different is provided. If the threshold Vth2 is the same as the threshold Vth1, a change due to noise of the power supply voltage VDD in the neighborhood of the threshold Vth1 such as shown in an area 101 causes a circuit to malfunction since the power-on reset signal and the power-down reset signal are sometimes produced and sometimes not produced. By providing the hysteresis characteristic, in the area 101, erroneous occurrence of the power-on reset signal and the power-down reset signal can be prevented.

The power-on reset signal POR is used for resetting various circuits such as a ferroelectric memory. The power-on reset signal is used, for example, for resetting an initial value of a logic circuit during power-on. The power-down reset signal is used, for example, for stopping a circuit operation before the power supply voltage drops during power-down.

Figure 2:
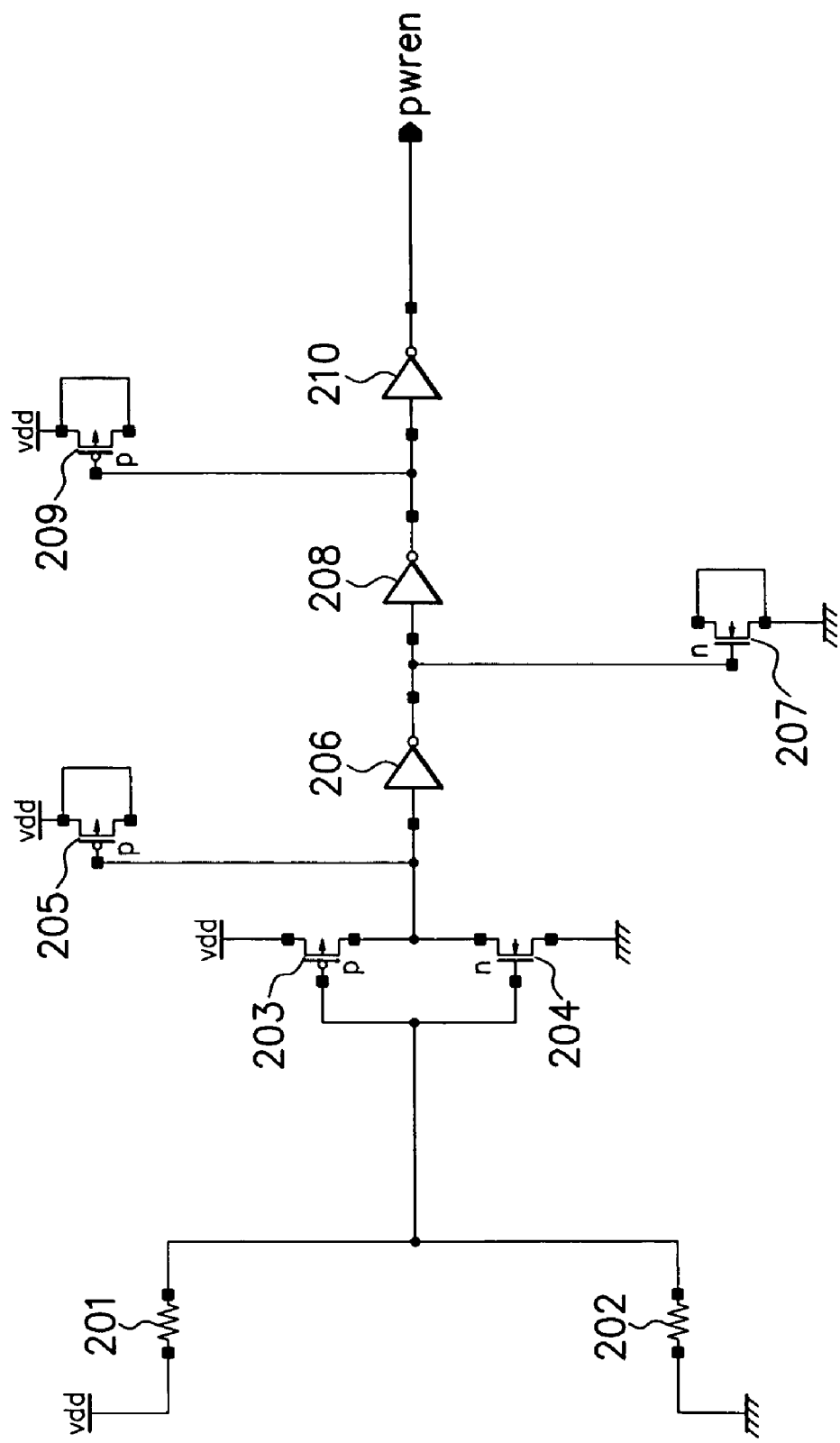
FIG. 2 is a circuit diagram showing a configuration example of a power supply detection circuit according to an embodiment.

FIG. 2 is a circuit diagram showing a configuration example of a power supply detection circuit according to this embodiment. Resistances 201 and 202 are connected in series between a power supply potential vdd and a reference potential Vss. Hereinafter, a MOS (metal-oxide semiconductor) field effect transistor (FET) is referred to only as a transistor. Transistors 203 and 204 compose one inverter. A gate of the p-channel transistor 203 is connected to an interconnection point between the resistances 201 and 202, a source thereof is connected to the power supply potential vdd, and a drain thereof is connected to a drain of the n-channel transistor 204. A gate of the n-channel transistor 204 is connected to the interconnection point between the resistances 201 and 202, a source thereof is connected to the reference potential (ground) vss. An interconnection point between the gates is an input terminal of the inverter 203, 204, and an interconnection point between the drains is an output terminal of the inverter 203, 204. Inverters 206, 208, and 210 connected in series are connected between the output terminal of the inverter 203, 204 and a terminal pwren.

A MOS capacitor 205 is composed of a p-channel transistor and connected between the output terminal of the inverter 203, 204 and the power supply potential vdd. Namely, a gate of the p-channel transistor 205 is connected to the output terminal of the inverter 203, 204, and a source and a drain thereof are connected to the power supply potential vdd. A MOS capacitor 207 is composed of an n-channel transistor and connected between an output terminal of the inverter 206 and the reference potential vss. Namely, a gate of the n-channel transistor 207 is connected to the output terminal of the inverter 206, and a source and a drain thereof are connected to the reference potential vss. A MOS capacitor 209 is connected between an output terminal of the inverter 208 and the power supply potential vdd in the same manner as the MOS capacitor 205.

Figure 5:
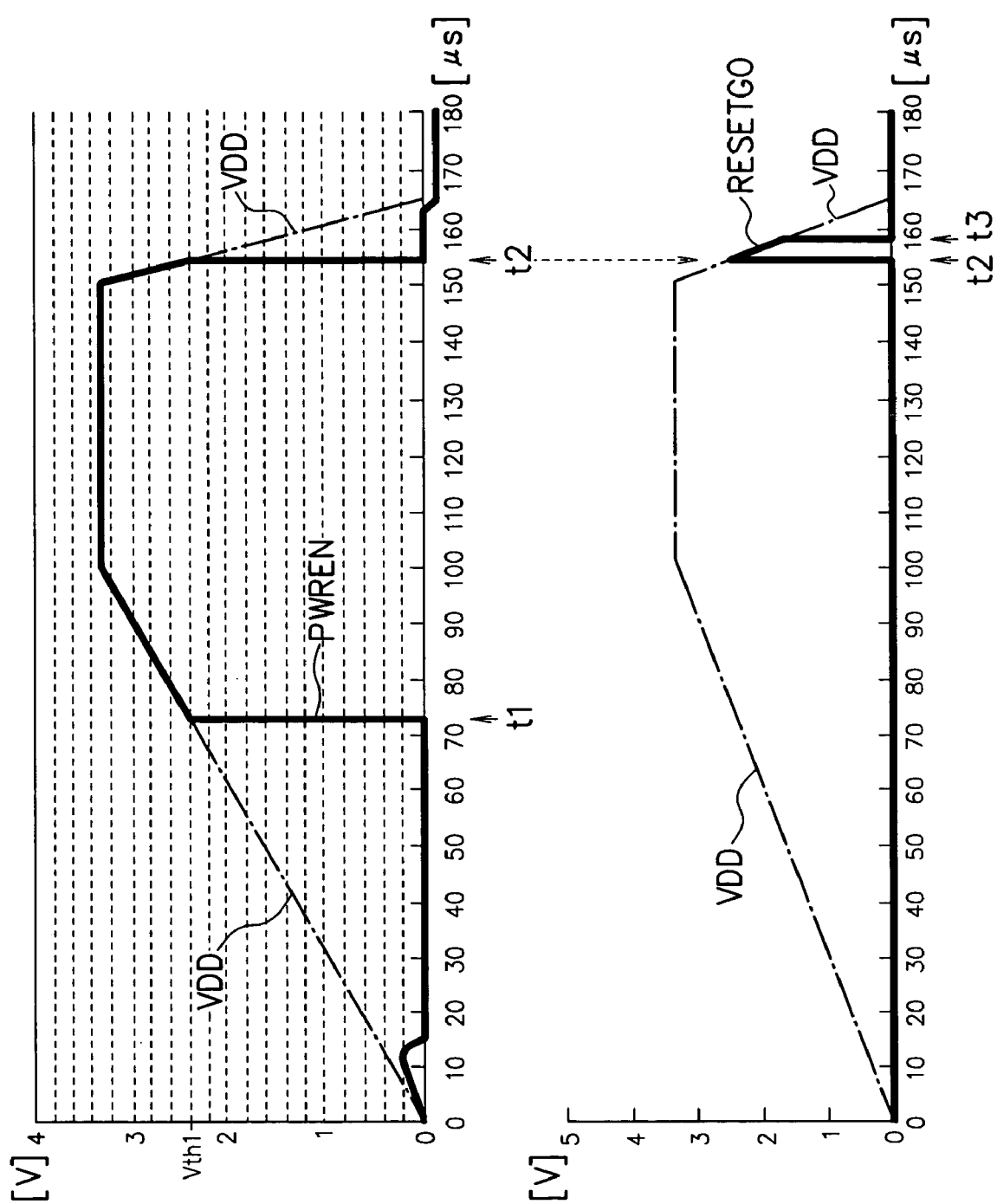
FIG. 5A is a waveform chart showing an example of a voltage PWREN.
FIG. 5B is a waveform chart showing an example of a voltage RESETGO.

FIG. 5A is a waveform chart showing an example of a voltage PWREN of the terminal pwren and the power supply voltage VDD (vdd). Referring to FIG. 5A, the operation of the power supply detection circuit in FIG. 2 will be explained.

From power-on to a point in time t1, an input voltage of the inverter 203, 204 is low. The inverter logically inverts the input voltage and outputs it. The inverter 203, 204 operates so as to output a high. An input terminal of the inverter 206 is connected to the power supply potential vdd via the MOS capacitor 205, and hence the inverter 206 operates so as to output a low. An input terminal of the inverter 208 is connected to the reference potential vss via the MOS capacitor 207, and hence the inverter 208 operates so as to output a high. An input terminal of the inverter 210 is connected to the power supply potential vdd via the MOS capacitor 209, and hence the inverter 210 operates so as to outputs a low. Consequently, an initial value of the voltage PWREN of the terminal pwren becomes low (0 V).

Then, when the power supply voltage VDD becomes the threshold Vth1 at the point in time t1 after power-on, an output voltage of the inverter 203, 204 changes from high to low. As a result, the voltage PWREN of the terminal pwren changes from low to high (power supply potential VDD). More specifically, a resistance ratio between the resistances 201 and 202 and the like are adjusted so that the inverter 203, 204 is inverted when the power supply voltage VDD reaches the threshold Vth1.

Incidentally, if the power supply potential vdd is directly connected to the input terminal of the inverter 203, 204, a stable operation cannot be expected since the inverter 203, 204 tries to be inverted before the power supply potential vdd rises sufficiently. By converting the level of the power supply potential vdd by the resistances 201 and 202, the inverter 203, 204 can be inverted after the power supply potential vdd rises sufficiently.

Thereafter, when the power supply voltage VDD drops to the threshold Vth2 at a point in time t2 after power-down, the output voltage of the inverter 203, 204 changes from low to high. As a result, the voltage PWREN of the terminal pwren changes from high to low.

Figure 3:
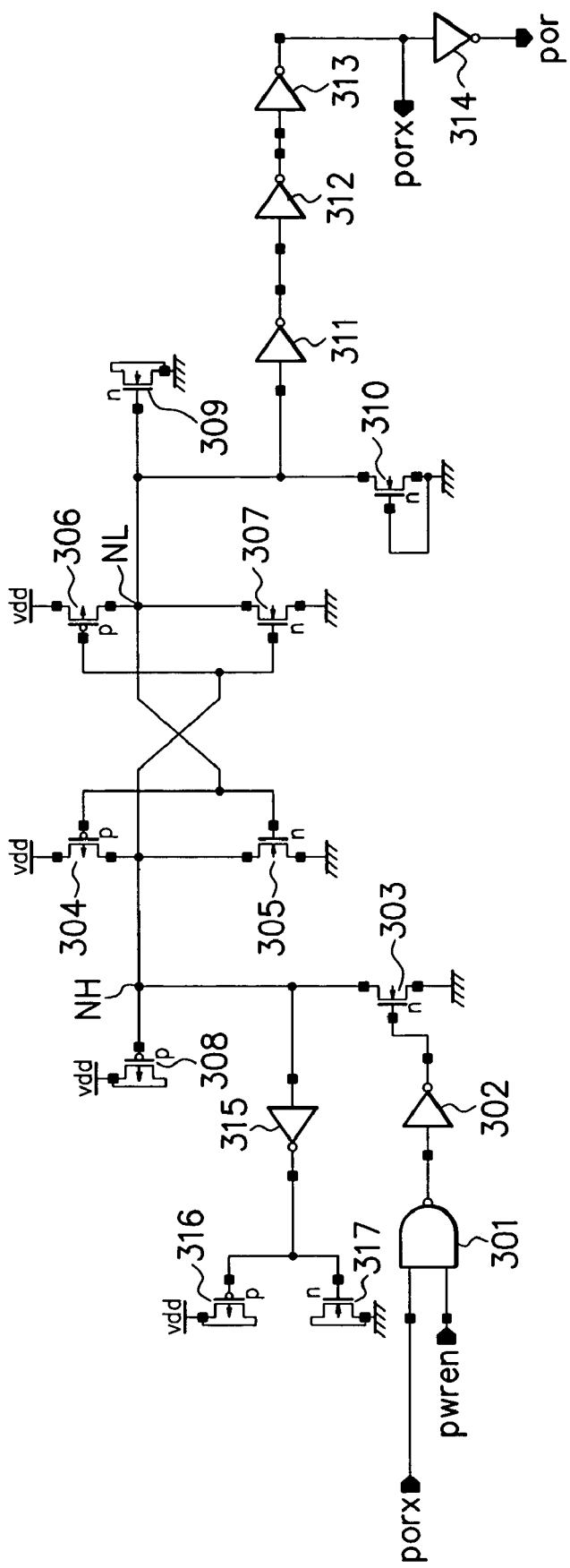
FIG. 3 is a circuit diagram showing a configuration example of an output circuit to output a power-on reset signal.

FIG. 3 is a circuit diagram showing a configuration example of an output circuit to output the power-on reset signal. A negative logical product (NAND) circuit 301 inputs signals of the terminal pwren and a terminal porx and outputs a NAND signal thereof. The terminal pwren is the same as the output terminal pwren in FIG. 2. The terminal porx is the same as an output terminal porx of an inverter 313. An input terminal of an inverter 302 is connected to an output terminal of the NAND circuit 301, and an output terminal thereof is connected to a gate of an n-channel transistor 303. A source of the n-channel transistor 303 is connected to the reference potential vss, and a drain thereof is connected to a node NH.

A gate of a p-channel transistor 304 is connected to a node NL, a source thereof is connected to the power supply potential vdd, and a drain thereof is connected to the node NH. A gate of an n-channel transistor 305 is connected to the node NL, a source thereof is connected to the reference potential vss, and a drain thereof is connected to the node NH. A gate of a p-channel transistor 306 is connected to the node NH, a source thereof is connected to the power supply potential vdd, and a drain thereof is connected to the node NL. A gate of an n-channel transistor 307 is connected to the node NH, a source thereof is connected to the reference potential vss, and a drain thereof is connected to the node NL.

A MOS capacitor 308 is composed of a p-channel transistor and connected between the power supply potential vdd and the node NH. A MOS capacitor 309 is composed of an n-channel transistor and connected between the reference potential vss and the node NL.

Inverters 311, 312, and 313 corrected in series are connected between the node NL and the terminal porx. An input terminal of an inverter 314 is connected to the terminal porx, and an output terminal thereof is connected to a terminal por. The reset signal POR in FIG. 1 is outputted from the terminal por.

A transistor 310 is provided to balance with the transistor 303, an inverter 315 is provided to balance with the inverter 311, and an inverter 316, 317 is provided to balance with the inverter 312, and they exert no influence on the operation.

Next, the operation of the output circuit will be explained. The transistors 304 and 305 compose one inverter. The transistors 306 and 307 compose one inverter. The inverter 304, 305 and the inverter 306, 306 compose one latch circuit, which stores a state. Namely, an input terminal of the inverter 304, 305 is connected to an output terminal of the inverter 306, 307, and an input terminal of the inverter 306, 307 is connected to an output terminal of the inverter 304, 305.

Manufacturing is performed so that the threshold voltage of the transistor 305 is high and the threshold voltage of the transistor 307 is low. The threshold voltages of the transistors 304 and 306 are set similarly. Thereby, at power-on, the node NH operates so as to go high, and the node NL operates so as to go low. Moreover, the node NH tries to go high since it is connected to the power supply potential vdd via the MOS capacitor 308, and the node NL tries to go low since it is connected to the reference potential vss via the MOS capacitor 309. Consequently, in an initial state during power-on, the node NH goes high and the node NL goes low.

The voltage PWREN of the terminal pwren is low until the point in time t1 in FIG. 5A, whereby the NAND circuit 301 outputs a high, and the inverter 302 inputs a low. The gate voltage of the transistor 303 goes low, whereby the transistor 303 is turned off. In other words, the nodes NH and NL remain in the aforementioned initial state. Since the node NL is low, the terminal porx is high, and the voltage POR (FIG. 1) of the terminal por is low.

Then, when the voltage PWREN of the terminal pwren goes high at the point in time t1, the NAND circuit 301 outputs a low, and the inverter 302 outputs a high. The gate voltage of the transistor 303 goes high, whereby the transistor 303 is turned on. Then, the node NH changes from high to low, and the node NL changes from low to high. As a result, the terminal porx goes low, and the voltage POR (FIG. 1) of the terminal por goes high. The above is the operation of generating the power-on reset signal POR during power-on.

Figure 4:
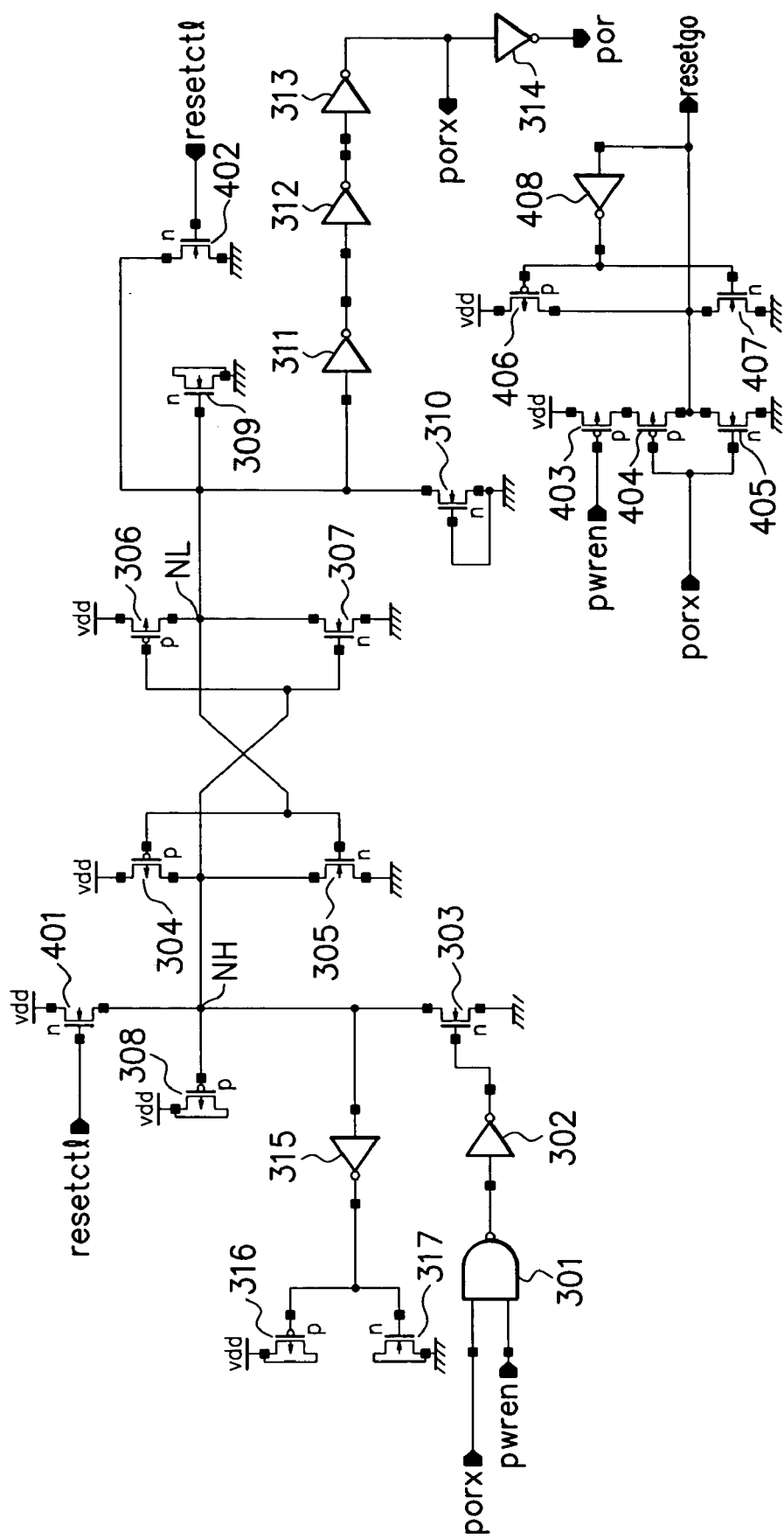
FIG. 4 is a circuit diagram showing a configuration example of an output circuit to output the power-on reset signal and a power-down reset signal.

FIG. 4 is a circuit diagram showing a configuration example of an output circuit to output the power-on reset signal and the power-down reset signal. The output circuit in FIG. 4 is configured by adding the following circuit to the output circuit in FIG. 3.

A gate of an n-channel transistor 401 is connected to a terminal resetctl, a drain thereof is connected to the power supply potential vdd, and a source thereof is connected to the node NH. A gate of an n-channel transistor 402 is connected to the terminal resetctl, a source thereof is connected to the reference potential vss, and a drain thereof is connected to the node NL. The voltage of the terminal resetctl will be explained later with reference to FIG. 6.

A gate of a p-channel transistor 403 is connected to the terminal pwren (FIG. 2), a source thereof is connected to the power supply potential vdd, and a drain thereof is connected to a source of a p-channel transistor 404. A gate of the p-channel transistor 404 is connected to the terminal porx, and a drain thereof is connected to a terminal resetgo. This terminal porx is the same as the output terminal porx of the inverter 313. A gate of an n-channel transistor 405 is connected to the terminal porx, a source thereof is connected to the reference potential vss, and a drain thereof is connected to the terminal resetgo.

An input terminal of an inverter 408 is connected to the terminal resetgo, and an output terminal thereof is connected to gates of transistors 406 and 407. A source of the p-channel transistor 406 is connected to the power supply potential vdd, and a drain thereof is connected to the terminal resetgo. A source of the n-channel transistor 407 is connected to the reference potential vss, and a drain there-of is connected to the terminal resetgo.

FIG. 5B is a waveform chart showing an example of a voltage RESETGO of the terminal resetgo and the power supply voltage VDD. Referring to FIG. 5B, the operation of the output circuit in FIG. 4 will be explained. The transistors 404 and 405 compose one inverter. Until the point in time t2, the voltage RESETGO of the terminal resetgo is low when the terminal porx is high. Moreover, since the voltage PRWEN of the terminal pwren is high when the terminal porx is low, the voltage RESETGO of the terminal resetgo is low. Namely, until the point in time t2, the voltage RESETGO is low.

Then, when the voltage PWREN of the pwren goes low at the point in time t2 in FIG. 5A, the voltage RESETGO of the terminal resetgo in FIG. 5B goes high. Incidentally, the operation in which the voltage RESETGO goes low at a point in time t3 will be explained later.

As described above, at the point in time t2 when the voltage PWREN falls, the startup signal RESETGO to generate the power-down reset signal during power-down occurs. Depending on conditions, the terminal resetgo sometimes becomes floating and does not rise to the power supply potential vdd, whereby the feedback circuit 406 to 408 is incorporated therein.

FIG. 6 is a circuit diagram showing a configuration example of a power-down detection circuit. A p-channel transistor 601 is diode-connected and connected between the power supply potential vdd and a node mon. Namely, a source of the p-channel transistor 601 is connected to the power supply potential vdd, a gate and a drain thereof are connected to the node mon. A MOS capacitor 602 is composed of an n-channel transistor and connected between the node mon and the reference potential vss. A gate of an n-channel transistor 603 is connected to a terminal pdx, a source thereof is connected to the node mon, and a drain thereof is connected to a drain of an n-channel transistor 604. A gate of the n-channel transistor 604 is connected to the terminal resetgo (FIG. 5), and a source thereof is connected to the reference potential vss.

A gate of a p-channel transistor 605 is connected to the node mon, a source thereof is connected to the power supply potential vdd, and a drain thereof is connected to a source of a p-channel transistor 606. A gate of the p-channel transistor 606 is connected to the node mon, and a drain thereof is connected to a node out1. A gate of an n-channel transistor 607 is connected to the node mon, a drain thereof is connected to the node out1, and a source thereof is connected to a drain of an n-channel transistor 608. A gate of the n-channel transistor 608 is connected to the node mon, and a source thereof is connected to the reference potential vss. A gate of a p-channel transistor 609 is connected to the node out1, a source thereof is connected to the drain of the transistor 605, and a drain thereof is connected to the reference potential vss. A gate of an n-channel transistor 610 is connected to the node out1, a source thereof is connected to the drain of the transistor 608, and a drain thereof is connected to the power supply potential vdd.

Between the node out1 and the terminal resetctl, inverters 611 and 612 are connected in series. This terminal resetctl is the same as the resetctl in FIG. 4.

Figures 7A, 7B:
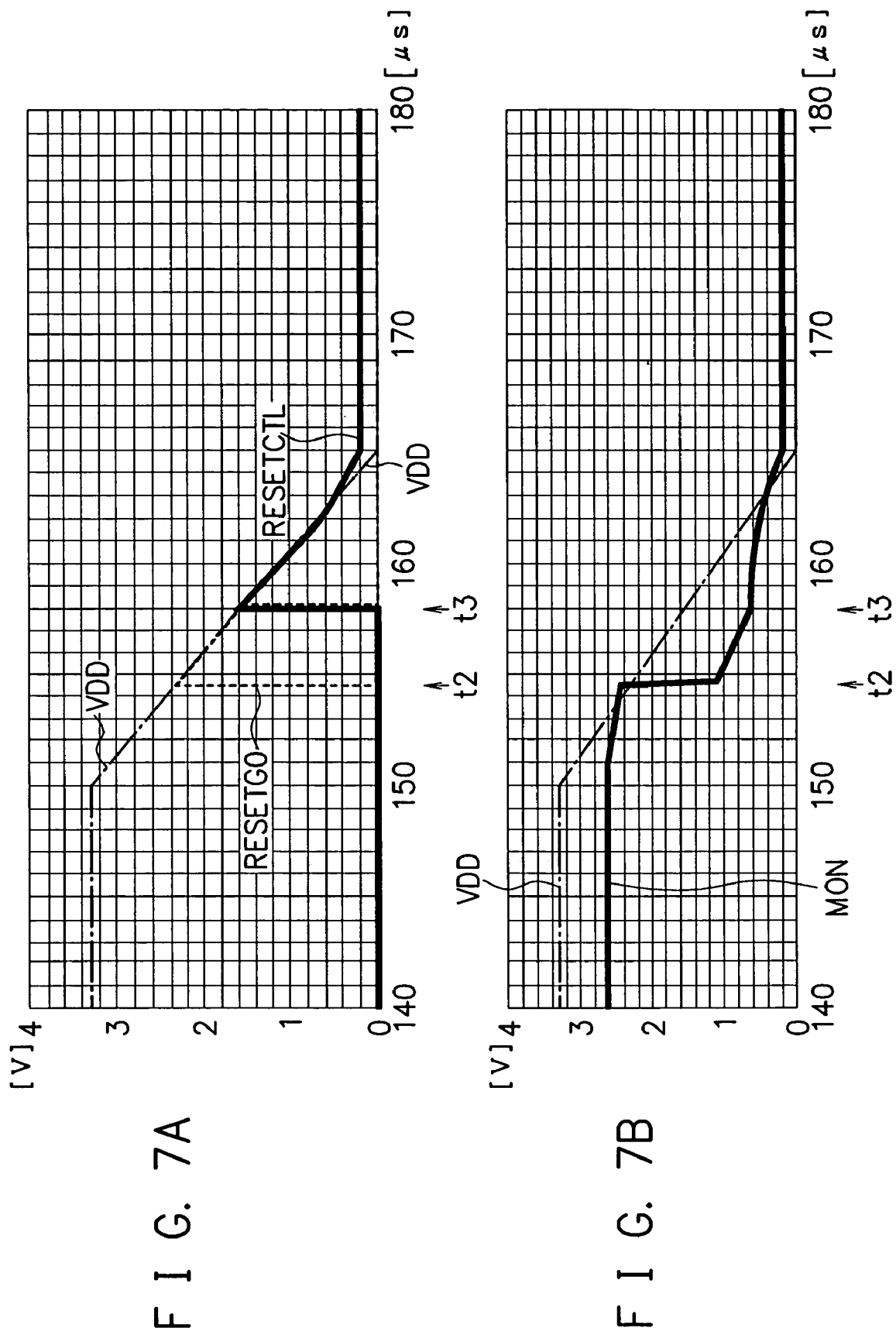
FIG. 7A is a waveform chart showing an example of the voltage RESETGO and a voltage RESETCTL.
FIG. 7B is a waveform chart showing an example of a voltage MON.

FIG. 7A is a waveform chart showing an example of the voltage RESETGO of the terminal resetgo, a voltage RESETCTL of the terminal resetctl, and the power supply voltage VDD, and FIG. 7B is a waveform chart showing an example of a voltage MON of the node mon and the power supply voltage VDD. Referring to FIG. 7A and FIG. 7B, the operation of the power-down detection circuit in FIG. 6 will be explained.

Until the point in time t2, the voltage RESETGO is low as explained in FIG. 5B, whereby the transistor (switch element) 604 is off. Since the transistor 601 is diode-connected, the voltage MON of the node mon is lower than the power supply voltage VDD by the threshold voltage of the transistor 601.

Then, when the voltage RESETGO goes high at the point in time t2, the transistor 604 is turned on. The transistor 601 determines the quantity supplied of an electric current, and the transistor 604 determines the quantity discharged of the electric current. The transistor 603 is a current limiting element, which can limit and reduce the current flowing between the transistors 601 and 604 (between the power supply potential vdd and the reference potential vss) to reduce power consumption. The terminal pdx has a reference voltage (for example, 1.0 V) lower than the power supply voltage VDD, and a generation circuit of this reference voltage will be explained later with reference to FIG. 9. When the transistor 604 is turned on, the voltage MOS drops and thereafter goes down with a gentle inclination. This inclination is determined by the voltage of the terminal pdx. The MOS capacitor 602 is a stabilization capacitor and can prevent undershoot of the voltage MON. Namely, by connecting the stabilization capacitor 602 to the node mon, immediately after the transistor 604 is turned on, the potential on the drain side is high, which can prevent a charge from being excessively extracted by high drive capability of the transistor 604 and thereby prevent an erroneous reset signal from being outputted. By applying a gate voltage which depends on the power supply voltage VDD and is lower than the power supply voltage VDD, a gate-source voltage vgs of the transistor 603 becomes relatively low when the power supply voltage VDD drops, and hence the transistor 603 does not lose a function as a current limiting element.

The p-channel transistor 601 has a p-type drain and an n-type well thereunder. This n-type well is connected to the power supply potential vdd. When the power supply potential vdd drops, a charge in the node mon is discharged in a forward direction via a diode of the p-type drain and the n-type well. Consequently, when the power supply voltage VDD drops, thanks to the p-channel transistor 601, the voltage MON can follow the drop in the power supply voltage.

The transistors 605 to 610 compose a Schmitt circuit. The Schmitt circuit is a kind of inverter, and logically inverts an input voltage and then outputs it. The Schmitt circuit 605 to 610 outputs a low when the voltage MON is higher than a threshold. As a result, the voltage RESETCTL goes low.

Then, when the voltage MOS becomes lower than the threshold after the point in time t3, the Schmitt circuit 605 to 610 outputs a high. The inverters 611 and 612 perform amplification, and consequently the voltage RESETCTL goes high.

As described above, when the voltage RESETGO goes high at the point in time t2, the transistor 604 is turned on and extracts the charge from the monitor node mon, and thereby the voltage MON sharply drops to a level at which the voltage MON is stabilized by a balance between the diode-connected p-channel transistor 601 and the n-channel transistor 604. Thereafter, the voltage MON changes with an inclination determined by the balance between the transistors 601 and 604, following the drop in the power supply voltage VDD. As a result, the voltage MON reaches the threshold of the Schmitt circuit 605 to 610 earlier than the power supply voltage VDD, so that the reset signal RESETCTL is outputted at an appropriate level. Here, the transistor 604 controlled by the voltage RESETGO has the gate-source voltage vgs=VDD, and its drain-source voltage vds is detected by the monitoring level MON through the transfer gate 603. Accordingly, immediately after the RESETGO goes high, the sufficient drain-source voltage vds can be secured, but the lower the monitoring level MON, the more difficult the securement of the drain-source voltage vds becomes, and hence the drive capability of the transistor 604 lowers, so that the excessive lowering of the monitoring level MON can be automatically prevented. Furthermore, by adjusting the gate potential of the transfer gate 603 located on the drain side of the transistor 604, the aforementioned drain-source voltage vds of the transistor 604 can be controlled. In this embodiment, by making the gate potential of the transfer gate 603 a power supply voltage interlock type, the current drive capability of the transfer gate 603 lowers by being changed by the power supply voltage VDD even when the power supply voltage VDD drops very slowly, so that the monitoring level MON can be secured, whereby the effect of keeping the threshold Vth2 (FIG. 1) at which the reset signal RESETCTL is generated almost constant independent of the inclination of the fall of the power supply voltage VDD.

If the power-down reset signal tries to be produced at the point in time t3 after a fixed period of time from the point in time t2 with a timer, the threshold Vth2 becomes high when the fall speed of the power supply voltage VDD is low, whereas the threshold Vth2 becomes low when the fall speed of the power supply voltage VDD is high. According to the fall speed, the threshold Vth2 changes. According to this embodiment, the monitoring level MON changes to follow the power supply voltage VDD, whereby the fixed threshold Vth2 can be secured irrespective of the fall speed of the power supply voltage VDD.

Incidentally, the Schmitt circuit 605 to 610 has a hysteresis characteristic that a threshold when the input voltage rises and a threshold when the input voltage drops are different. In this embodiment, the operation when the input voltage MON drops is important, and the operation when the input voltage MON rises need not be considered. Therefore, the transistor 609 may be eliminated.

Moreover, the Schmitt circuit 605 to 606 may be replaced with a simple inverter. Namely, it is required to eliminate the transistors 605, 608 to 610, connect the source of the p-channel transistor 606 to the power supply potential vdd, and connect the source of the n-channel transistor 607 to the reference potential vss. The Schmitt circuit can ensure a stable high-precision operation since it has a characteristic that its output voltage changes more sharply as compared with the change of its input voltage.

FIG. 8 is a circuit diagram showing a configuration example of another power-down detection circuit substituted for the power-down detection circuit in FIG. 6. The circuit in FIG. 8 is configured by adding a p-channel transistor 801 to the circuit in FIG. 6. A gate of the p-channel transistor 801 is connected to a terminal V1, a source thereof is connected to the power supply potential vdd, and a drain thereof is connected to the node mon. Namely, the transistor 801 is connected in parallel with the transistor 601.

The charge is supplied to the monitoring level MON from the diode-connected transistor 601, and given to the voltage which has dropped by the threshold voltage of the transistor 601 compared with the power supply voltage VDD. However, when the change of the power supply voltage VDD is sharp, that is, when the power supply voltage VDD drops shortly after the power-on reset signal is outputted, the monitoring level MON does not sometimes sufficiently rise. As measures against this case, it is possible to provide the transistor 801 as a path to reset the initial value of the monitoring level MON to ensure the monitoring level MON. By turning the transistor 801 on, the monitoring level MON can be raised to the power supply voltage VDD.

The terminal resetctl in FIG. 4 will be explained. The voltage RESETCTL of the terminal resetctl changes from low to high at the point in time t3 in FIG. 7A. When the terminal resetctl is low, the transistors 401 and 402 are off. When the terminal resetctl goes high at the point in time t3, the transistors 401 and 402 are turned on. As a result, the node NH is reset high, and the node NL is reset low. Consequently, the terminal porx goes high, and the terminal por goes low. Namely, in FIG. 1, the voltage POR of the terminal por goes low. The aforementioned reset signal POR during power-down becomes a power-down reset signal. Incidentally, when the terminal porx goes high, in FIG. 5B and FIG. 7A, the voltage RESETGO of the terminal resetgo goes low. Since the nodes NH and NL are reset as described above, the reset signal POR can be normally generated without malfunction even if the power is turned on again immediately after power-down. Namely, the waiting time from power-down to the next power-on can be shortened.

Next, a case where the power supply returns instantaneously after an instantaneous power supply voltage drop after power-on will be explained. In FIG. 8, when the power supply voltage VDD drops instantaneously to 0 V, the charge in the node mon is discharged to the n-type well via the drain of the transistor 601, and consequently the node mon becomes 0 V. Namely, the p-channel transistor 601 includes the p-type drain and the n-type well thereunder. This n-type well is connected to the power supply potential vdd. When the power suppy potential vdd becomes 0 V, the charge in the node mon is discharged in a forward direction via the diode of the p-type drain and the n-type well.

Although the node mon becomes 0 V, the Schmitt circuit 605 to 610 cannot output a high since the power supply potential vdd drops instantaneously to 0 V. Namely, the reset signal RESETCTL cannot output a high. Thereafter, when the power supply potential Vdd returns instantaneously, the Schmitt circuit 605 to 610 outputs a high, and the reset signal RESETCTL goes high. As a result, the node NH in FIG. 4 is reset high, and the node NL is reset low, which makes a normal operation possible.

Figure 9:
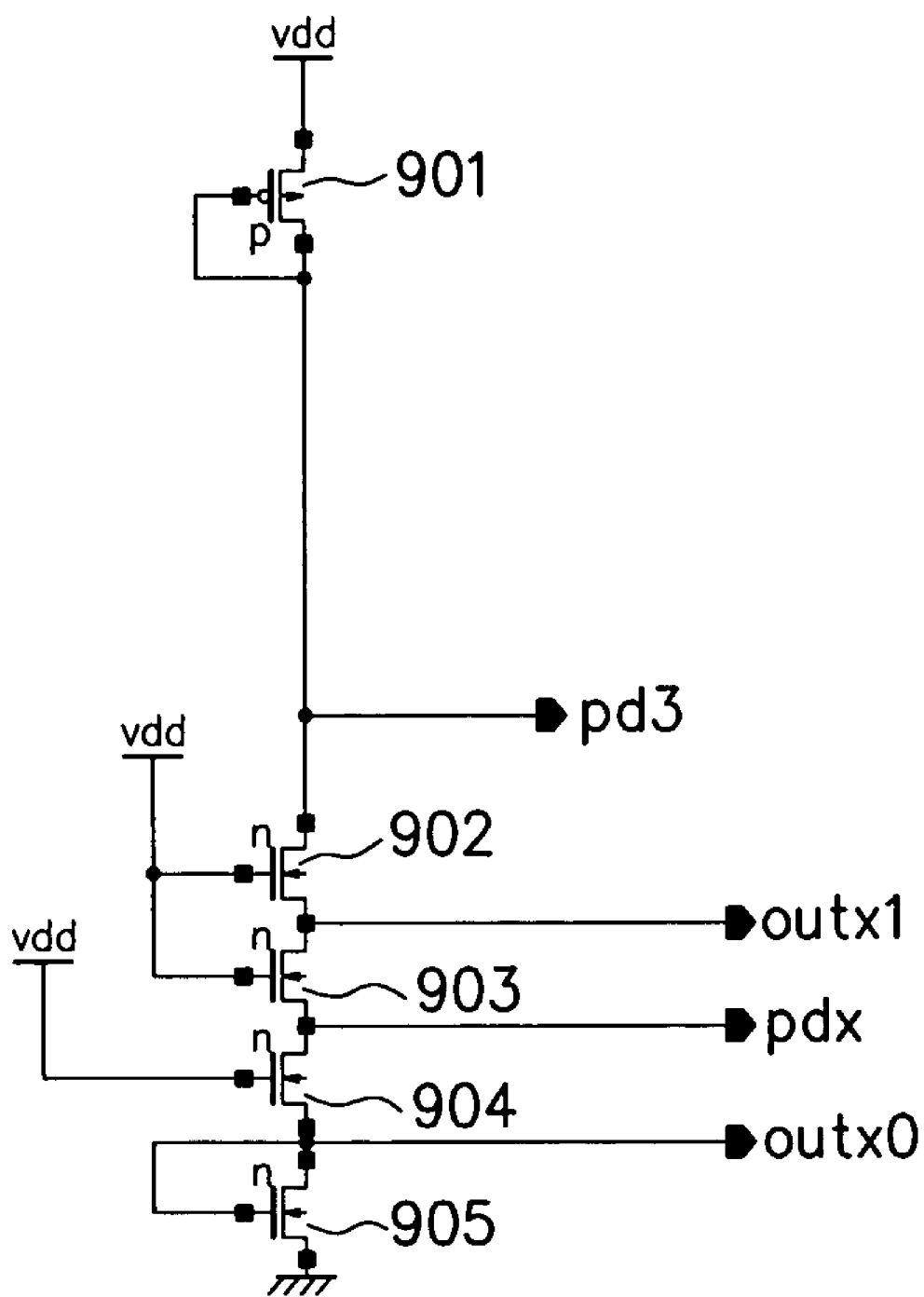
FIG. 9 is a circuit diagram showing a configuration example of a reference voltage generation circuit.

FIG. 9 is a circuit diagram showing a -generation circuit of a reference voltage to be inputted to the terminal pdx in FIG. 8. A source of a p-channel transistor 901 is connected to the power supply potential vdd, a gate and a drain thereof are connected to a terminal pd3. A gate of an n-channel transistor 902 is connected to the power supply potential vdd, a drain thereof is connected to the terminal pd3, and a source thereof is connected to a terminal outx1. A gate of an n-channel transistor 903 is connected to the power supply potential vdd, a drain thereof is connected to the terminal outx1, and a source thereof is connected to the terminal pdx. A gate of an n-channel transistor 904 is connected to the power supply potential vdd, a drain thereof is connected to the terminal pdx, and a source thereof is connected to a terminal outx0. A gate and a drain of an n-channel transistor 905 are connected to the terminal outx0, and a source thereof is connected to the reference potential vss.

Namely, the p-channel transistor 901 is diode-connected and connected to the power supply potential vdd. The n-channel transistor 905 is diode-connected and connected to the reference potential vss. Between the transistors 901 and 905, three transistors 902 to 904 are connected in series. The transistors 902 to 904 function as resistances.

FIG. 10 is a graph showing reference voltages of the terminals pd3, outx1, pdx, and outx0 in FIG. 9. The horizontal axis shows the power supply voltage VDD, and the vertical axis shows reference voltage. The reference voltage of each terminal shows a voltage value with respect to temperature change from 0° C. to 70° C. As concerns the reference voltages of the terminals pd3 and outx1, an upper characteristic line shows a reference voltage at 70° C., and a lower characteristic line shows a reference voltage at 0° C. As concerns the terminal outx0, an upper characteristic line shows a reference voltage at 0° C., and a lower characteristic line shows a reference voltage at 70° C. The characteristics of the reference voltages of the terminals pd3, outx1, and outx0 change in relation to temperature change. The characteristic of the reference voltage of the terminal pdx is almost the same even if the temperature is changed from 0° C. to 70° C. Hence, the reference potential of the terminal pdx which is hardly temperature-dependent is used as a gate potential of the transistor 603 in FIG. 8. The circuit in FIG. 8 can prevent characteristic change due to temperature.

Figure 11:
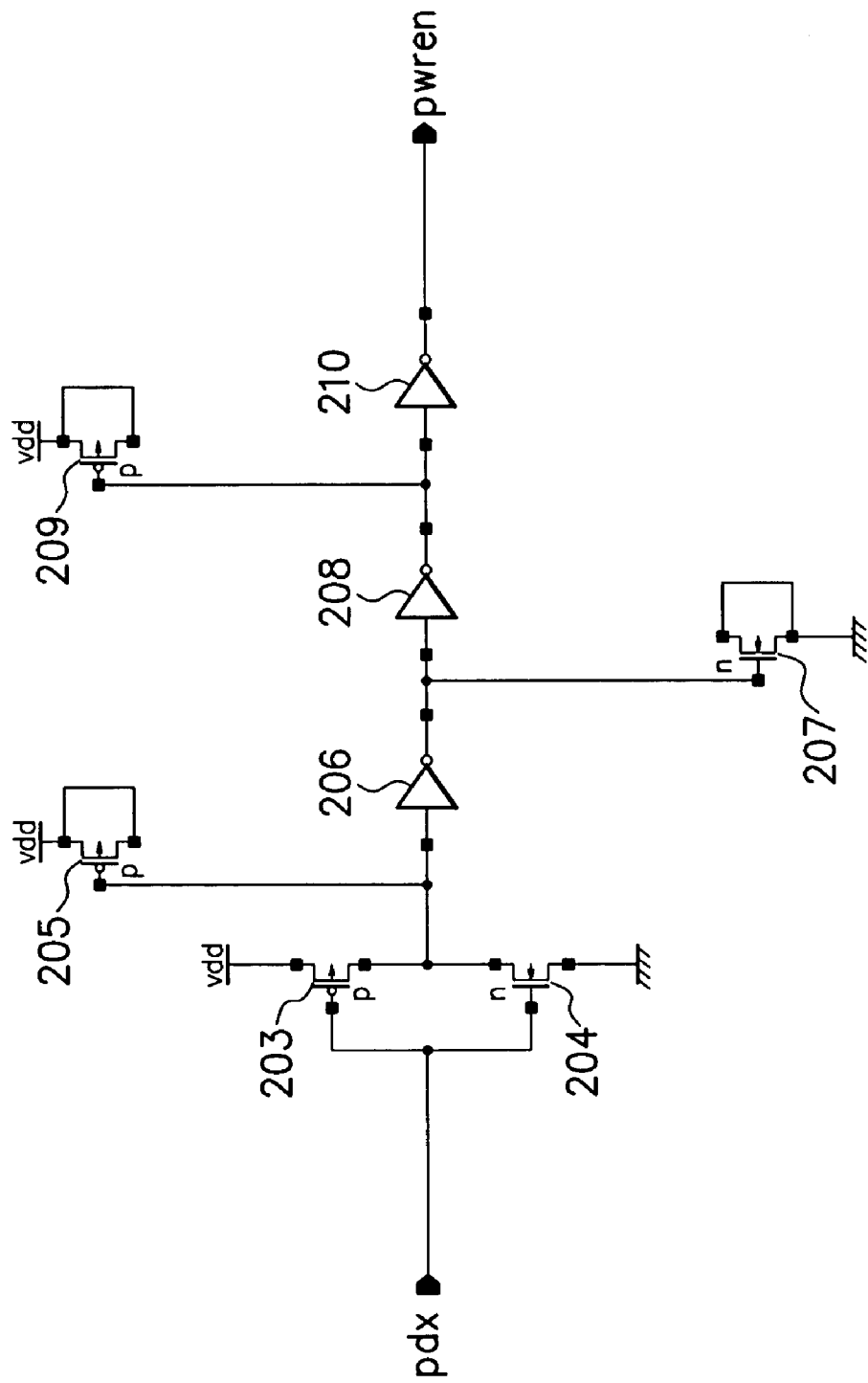
FIG. 11 is a circuit diagram showing a configuration example of another power supply detection circuit.

FIG. 11 is a circuit diagram showing a configuration example of another power supply detection circuit substituted for the power supply detection circuit in FIG. 2. The circuit in FIG. 11 is configured by eliminating the resistances 201 and 202 in the circuit in FIG. 2 and adding the terminal pdx. The terminal pdx is connected to the gates of the transistors 203 and 204, and the reference voltage generated by the reference voltage generation circuit in FIG. 9 is applied thereto. The circuit in FIG. 11 performs the same operation as the circuit in FIG. 2. The reference voltage generation circuit in FIG. 9 is used as a circuit which generates the reference voltage of the terminal pdx of both the power supply detection circuit in FIG. 2 and the power-down detection circuit in FIG. 8, which makes a reduction in circuit scale possible. Moreover, the temperature dependency of the circuit operation can be reduced.

As described above, the power supply detection circuit in FIG. 2 outputs the high-level voltage PWREN when a first voltage according to the power supply voltage is higher than a first threshold and outputs the low-level voltage PWREN when the first voltage is lower than the first threshold during power-on and power-down. The power-down detection circuit in FIG. 6 outputs the reset signal RESETCTL when the voltage MON according to the power supply voltage VDD becomes lower than a second threshold after the low-level voltage PWREN is outputted during power-down. The output circuit in FIG. 4 outputs the power-on reset signal POR which changes from low to high when the high-level voltage PWREN is outputted during power-on, and outputs the power-down reset signal POR which changes from high to low when the reset signal RESETCTL is outputted during power-down.

The reset circuit in this embodiment is obtained by uniting the power-on reset circuit to generate the power-on reset signal and the power-down reset circuit to generate the power-down reset signal. The power supply detection circuit is used both when the power-on reset signal is generated and when the power-down reset signal is generated, which makes it possible to realize the small-sized reset circuit. Moreover, the power-down detection circuit detects power-down according to the output of the low-level voltage PWREN during power-down, which facilitates the timing control of the power-down reset signal during power-down, so that a poor startup when the power is repeatedly turned on/off can be prevented.

This embodiment aims at a more stable circuit characteristic by adding a self-reset function having a hysteresis characteristic to "a circuit which converts the level of a power supply voltage, receives an output thereof by an inverter or the like, and generates a reset signal at a threshold of the inverter". The added function is the hysteresis characteristic which is indispensable as a characteristic of a power supply detection circuit. The Schmitt circuit is well-known as a circuit having this hysteresis characteristic. If a change in power-supply level occurs in the vicinity of the reference potential and the threshold of the inverter or the like in the power supply detection circuit, the power supply detection circuit has a danger of oscillating, and to avoid this danger, the provision of a dead zone using the Schmitt circuit is thought of. However, the dead zone of the Schmitt circuit utilizes feedback, whereby the width of the dead zone changes greatly according to the power supply voltage. Therefore, a characteristic ideal for the power supply detection circuit cannot be obtained by the Schmitt circuit alone since in addition to a change in transistor characteristic according to the process parameter, there is a change in dead zone width according to the level of the power supply voltage. Moreover, the lower the power supply voltage, the narrower the dead zone width becomes, whereby the hysteresis characteristic cannot be expected at a low power supply voltage.

In this embodiment, the hysteresis characteristic is realized by the threshold of the transistor 601 and the balance between the p-channel transistor 601 and the n-channel transistor 604 without using relative feedback. As a result, the minimum hysteresis is almost ensured by the threshold of the transistor 601, and moreover, by using the balance between the p-channel transistor 601 and the n-channel transistor 604, the control potential MON of the circuit which generates the reset signal RESETCTL by a characteristic dependent on the fall speed of the power supply voltage changes, whereby the reset timing independent of the fall speed of the power supply voltage can be controlled. By using this reset signal RESETCTL, the nodes NH and NL of the reset circuit can be forcibly initialized, which makes it possible to reduce the waiting time until the charges in the nodes NH and NL are extracted to the shortest possible time and hold down the occurrence rate of a poor startup of the reset circuit.

Since a reset is triggered during power-down, as in the case where power is turned on, the potentials of the nodes are determined respectively with the rise of the power supply voltage, and without the entire circuit being brought into an initial state, the nodes are forcibly shifted to the initial state at the stage where the reset is triggered, whereby instability at the time of state transition can be eliminated. Moreover, once a reset is triggered, the initial state can be ensured, whereby it is unnecessary to provide a waiting time until the charges in the critical nodes NH and NL are extracted after the power supply voltage drops to the ground. Since the critical nodes NH and NH are initialized, a normal operation becomes possible in the next cycle even if the power supply voltage does not drop to the ground.

One circuit is used as both the power supply detection circuit during power-on and the power supply detection circuit during power-down, which can reduce the number of elements in the circuit. Furthermore, the power supply detection circuit during power-on and the power-down detection circuit to trigger a reset during power-down are synchronized, and hence the hysteresis characteristic is difficult to degrade even if there is a process change.

Figure 12:
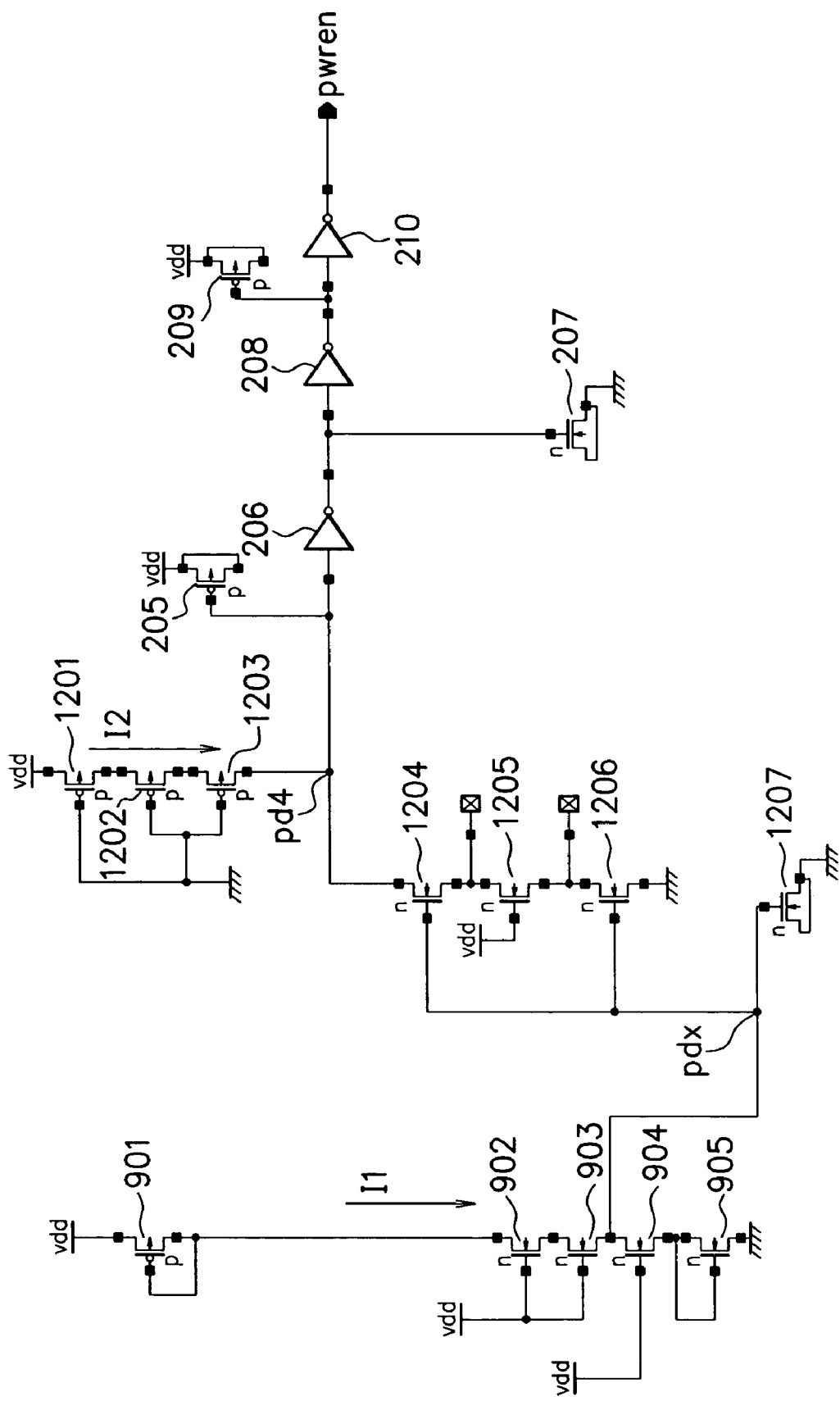
FIG. 12 is a circuit diagram showing a configuration example of still another power supply detection circuit.

FIG. 12 is a circuit diagram showing a configuration example of still another power supply detection circuit substituted for the power supply detection circuit in FIG. 11. The circuit in FIG. 12 is configured by eliminating the transistors 203 and 204 from the circuit in FIG. 11 and adding the transistors 1201 to 1206 and the MOS capacitor 1207 thereto. The circuit of the transistors 901 to 905 to generate the reference voltage of the terminal pdx is the same as that in FIG. 9. Points in which the circuit in FIG. 12 is different from the circuit in FIG. 11 will be explained below.

Gates of p-channel transistors 1201 to 1203 are connected to the reference potential vss. A source of the transistor 1201 is connected to the power supply potential vdd, a drain thereof is connected to a source of the transistor 1202. A source of the transistor 1203 is connected to a drain of the transistor 1202, and a drain thereof is connected to a node pd4. Namely, three transistors 1201 to 1203 are connected in series between the power supply potential vdd and the node pd4. The node pd4 is connected to the input terminal of the inverter 206.

A gate of an n-channel transistor 1204 is connected to the terminal pdx, a drain thereof is connected to the node pd4, a source thereof is connected to a drain of an n-channel transistor 1205. A gate of the transistor 1205 is connected to the power supply potential vdd, and a source thereof is connected to a drain of an n-channel transistor 1206. A gate of the transistor 1206 is connected to the terminal pdx, and a source thereof is connected to the reference potential vss. Namely, three transistors 1204 to 1206 are connected in series between the node pd4 and the reference potential vss. The transistor 1205 functions as a resistance. The terminal pdx may be connected to the gate of the transistor 1205.

Similarly to the MOS capacitor 207, a MOS capacitor 1207 is composed of an n-channel transistor, and connected between the terminal pdx and the reference potential vss. The MOS capacitor 1207 has a function of leading the initial value of the terminal pdx to a low level and a function as a stabilization capacitor.

The transistors 1201 to 1206 have the same function as the inverter of the transistors 203 and 204 in FIG. 11. The transistors 1201 to 1203 function as resistances. When the voltage of the terminal pdx is lower than the threshold voltage of the transistors 1204 and 1206, the transistors 1204 and 1206 are turned off, and the inverter output node pd4 goes high. When the voltage of the terminal pdx is not lower than the threshold voltage of the transistors 1204 and 1206, the transistors 1204 and 1206 are turned on, and the inverter output node pd4 goes low. By the aforementioned operation, the power supply detection circuit in FIG. 12 can perform the same operation as the power supply detection circuits in FIG. 2 and FIG. 11.

In the circuit in FIG. 11, there is a demand that the threshold of the inverter composed of the transistors 203 and 204 should be raised. However, it is not easy to raise the threshold thereof. The circuit in FIG. 12 has the advantage of being able to easily raise the threshold of the n-channel transistors 1204 and 1206. Furthermore, the circuit in FIG. 12 can prevent a bad influence exerted by threshold change due to process variation of the p-channel transistor 203 in FIG. 11.

However, in the circuit in FIG. 12, to detect both power-on and power-down, it is necessary to always monitor the power supply voltage VDD. Therefore, there is a problem that during standby after the output terminal pwren changes from low to high, leakage currents I1 and I2 always flow, which results in an increase in power consumption. The leakage current I1 is a current flowing through the transistors 901 to 905. The leakage current I2 is a current flowing through the transistors 1201 to 1203. A circuit to solve the aforementioned problem will be explained below with reference to FIG. 13.

Figure 13:
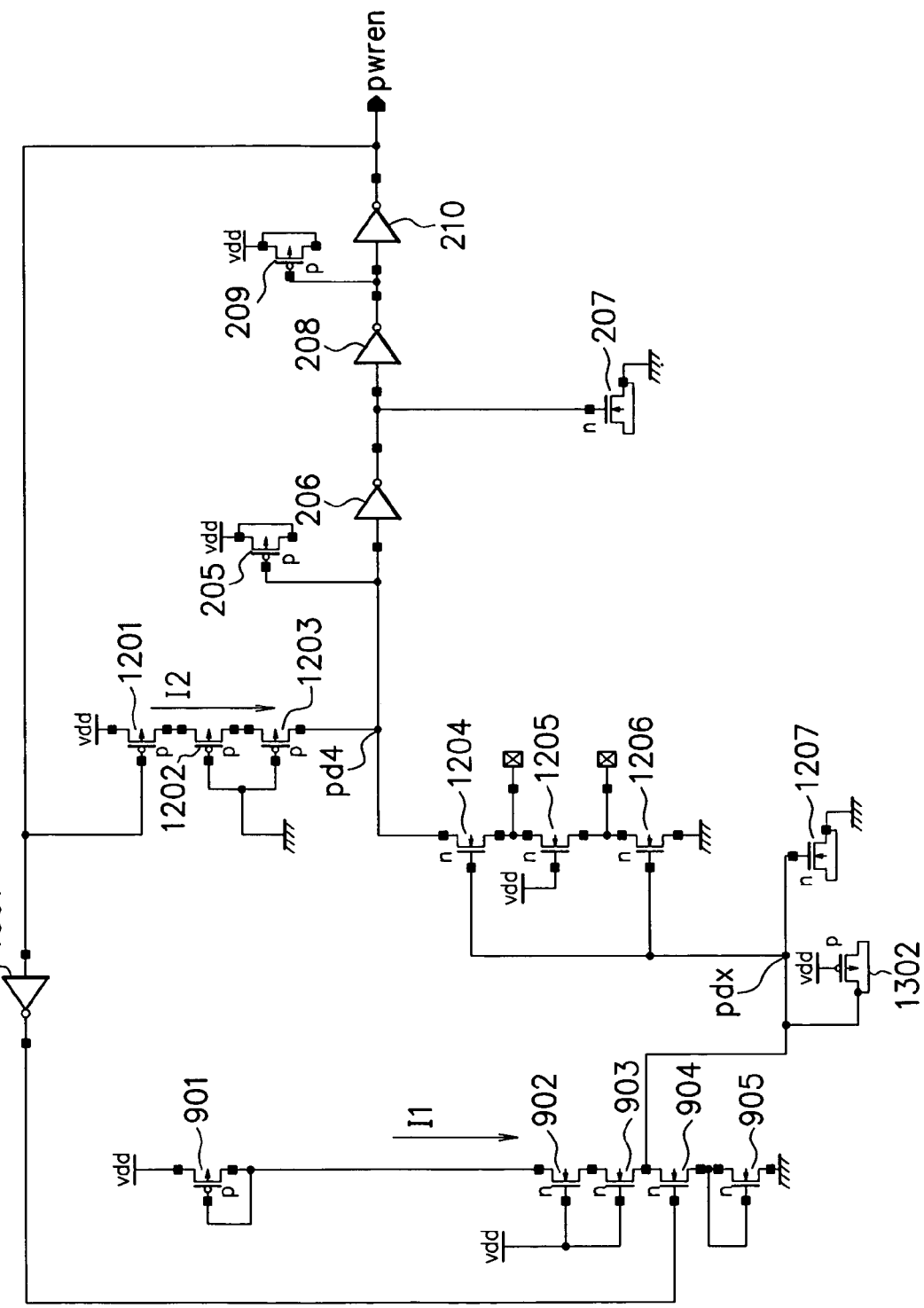
FIG. 13 is a circuit diagram showing a configuration example of yet another power supply detection circuit.
Figure 14:
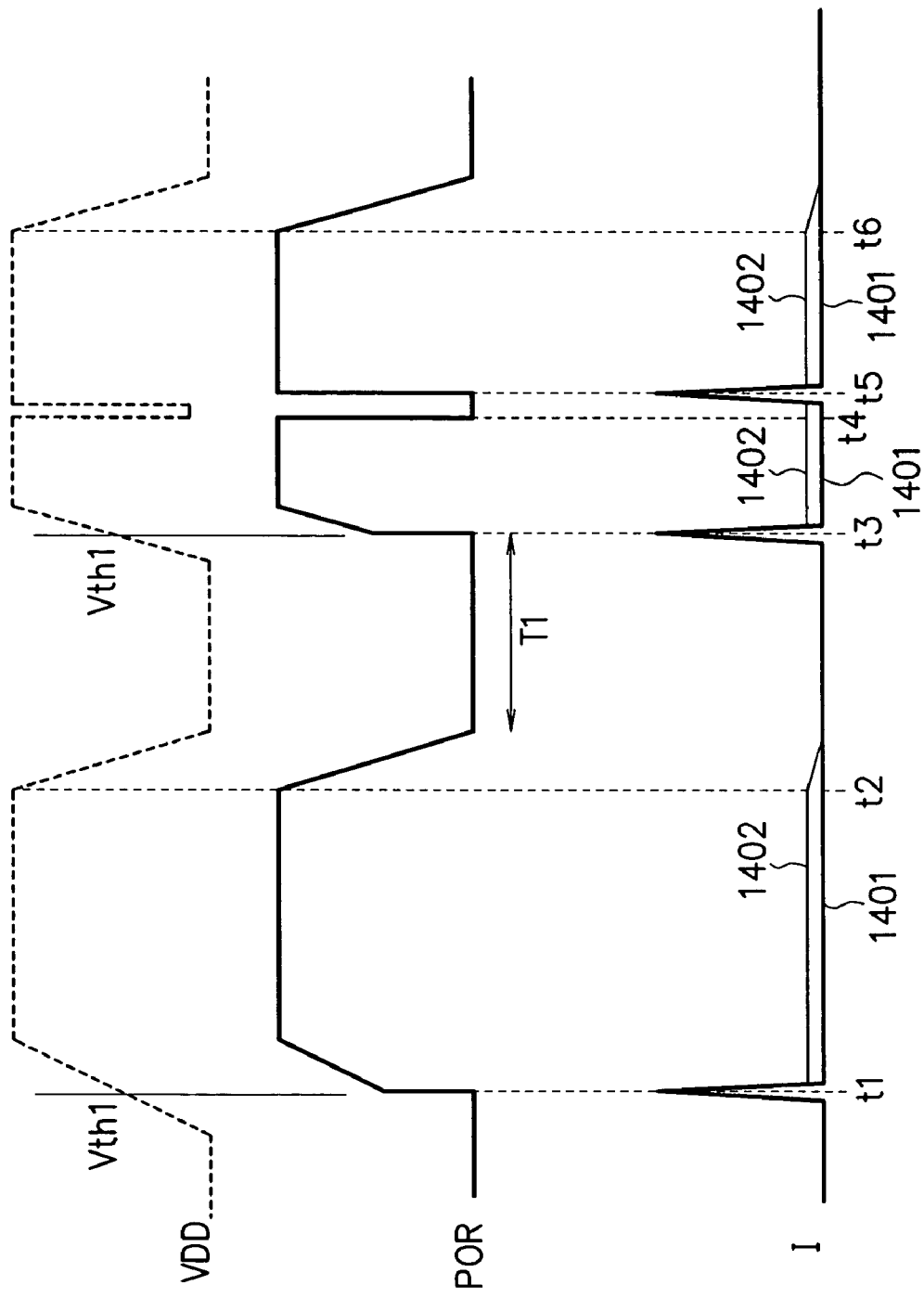
FIG. 14 is a timing chart for explaining the operation of the power supply detection circuit in FIG. 13.

FIG. 13 is a circuit diagram showing a configuration example of yet another power supply detection circuit substituted for the power supply detection circuit in FIG. 12, and FIG. 14 is a timing chart for explaining the operation thereof. The circuit in FIG. 13 is configured by adding an inverter 1301 and a p-channel transistor 1302 to the circuit in FIG. 12. This addition can be realized by changing wiring of a mealy layer of a semiconductor device, and the circuit in FIG. 12 and the circuit in FIG. 1e can be switched easily. Points in which the circuit in FIG. 13 is different from the circuit in FIG. 12 will be explained below.

The gate of the p-channel transistor 1201 is connected to the terminal pwren. The inverter 1301 logically inverts the voltage of the terminal pwren and outputs it to the gate of the n-channel transistor 904. This transistor 904 is a transistor connected between the terminal pdx and the reference potential vss. When the output terminal pwren changes from low to high during power-on, the p-channel transistor 1201 is turned off since its gate goes high, whereby the leakage current I2 does not flow. Then, the n-channel transistor 904 is turned off since its gate goes low, whereby the leakage current I1 does not flow. As a result, in a standby state after the detection of power-on, the leakage current can become 0 A. Thereafter, the output terminal pwren remains high at the same voltage as the power supply voltage VDD, and power-down is not detected. Namely, the power-down reset signal is not generated.

The circuit in FIG. 12 generates the power-on reset signal and the power-down reset signal, and hence needs to always monitor the power supply voltage VDD. As a result, constantly the currents I1 and I2 flow and electric power is consumed. However, depending on uses of the reset circuit, the power-down reset signal is sometimes unnecessary. In other words, the time until a charge remaining in an internal node of the circuit is discharged can be sometimes secured. Hence, in the circuit in FIG. 13, only power-on can be detected, and the stand-by currents I1 and I2 can be cut off.

A gate of the p-channel transistor 1302 is connected to the power supply potential vdd, and a source and a drain thereof is connected to the terminal pdx. After the transistor 904 is turned off, the terminal pdx remains high. After the transistor 1201 is turned off, the node pd4 remains low. When the power supply returns instantaneously after an instantaneous power supply voltage drop after the detection of power-on, a charge remains in the terminal pdx during this period of time, which causes a problem that the terminal pdx remains high and the reset signal POR also remains high. By providing the p-channel transistor 1302, the charge in the pdx can be discharged and extracted in the case of the instantaneous power supply voltage drop.

The p-channel transistor 1302 includes a p-type drain, a p-type source, and an n-type well thereunder. This n-type well is connected to the power supply potential vdd. When the power supply potential vdd drops, the charge in the terminal pdx is discharged in a forward direction via a diode of the p-type drain (source) and the n-type well. Therefore, when the power supply voltage VDD drops instantaneously, the terminal pdx can follow the power supply voltage drop thanks to the p-channel transistor 1302. As a result, even in the case of the instantaneous power supply voltage drop, the reset signal POR can become 0 V following the power supply voltage VDD. When the power supply returns, the terminal pwren changes from low to high, and the critical nodes NH and NL can be reset.

When the output terminal pwren changes from-low to high at a point in time t1 in FIG. 14, the reset signal POR also changes from low to high, and thereby the power-on reset signal is generated. At the time of this change, a current I flows in a pulse form. The current I indicates a total current of the whole reset circuit. Thereafter, in the circuit in FIG. 12, a standby current 1402 which is a total leakage current of the leakage currents I1 and I2 flows. In the circuit in FIG. 13, the leakage currents I1 and I2 can be prevented, and hence a standby current 1401 can be 0 V.

When the power is turned down at a point in time t2, the power supply voltage VDD drops. The reset signal POR drops while keeping the same voltage as the power supply voltage VDD, so that the power-down reset signal is not generated.

At a point in time t3, similarly to the point in time t1, the power-on reset signal is generated. A period T1 is a period from when the power supply voltage VDD becomes 0 V by power-down until power-on is detected again. When the p-channel transistor 1302 is not provided, the charge in the terminal pdx remains without being discharged after power-down, and therefore the period T1 needs to be made longer. Namely, unless the period T1 from power-down to the next power-on is made longer, the power-on reset signal cannot be generated. By providing the p-channel transistor 1302, the charge in the terminal pdx after power-down can be discharged, and the period T1 can be made shorter.

At a point in time t4, the power supply voltage VDD makes an instantaneous power supply voltage drop, and the power supply returns instantaneously. Thanks to the p-channel transistor 1302, when the power supply voltage VDD drops instantaneously, the terminal pdx can follow the power supply voltage drop. As a result, even in the case of the instantaneous power supply voltage drop, the reset signal POR can become 0 V, following the power supply voltage VDD.

At a point in time t5, the output terminal pwren changes from low to high, and the current I flows in a pulse form. The reset signal POR changes from low to high. Thereby, the critical nodes NH and NL can be reset.

At a point in time t6, similarly to the point in time t2, when the power is turned down, the power supply voltage VDD drops. The reset signal POR drops while keeping the same voltage as the power supply voltage VDD, so that the power-down reset signal is not generated.

As described above, when the output terminal pwren goes high, current paths of the currents I1 and I2 are cut off, which can eliminate a leakage current during standby, resulting in a reduction in power consumption.

Figure 15:
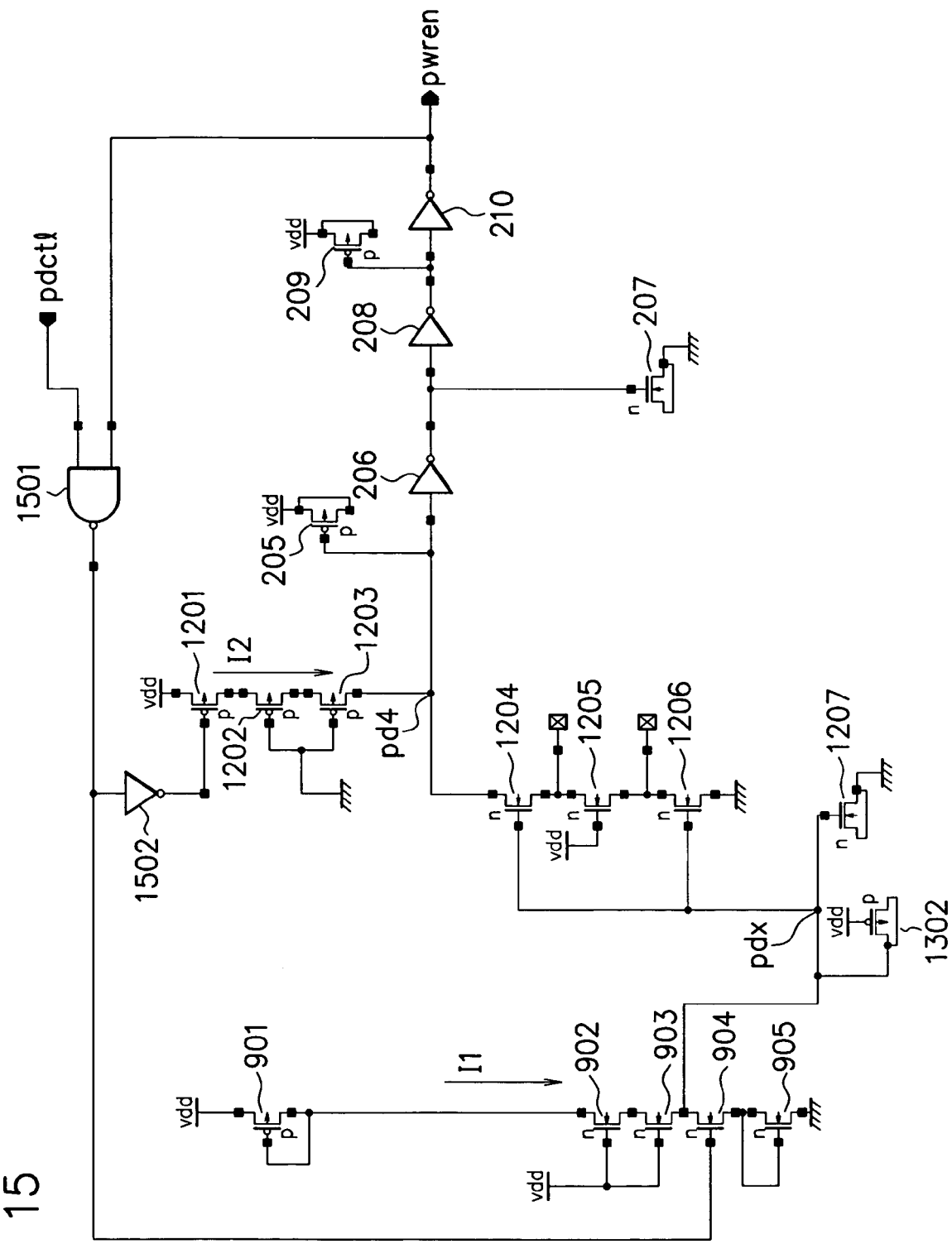
FIG. 15 is a circuit diagram showing a configuration example of still yet another power supply detection circuit.

FIG. 15 is a circuit diagram showing a configuration example of still yet another power supply detection circuit substituted for the power supply detection circuit in FIG. 13. In the circuit in FIG. 15, a circuit mode in FIG. 12 and a circuit mode in FIG. 13 can be switched. The circuit in FIG. 15 is configured by eliminating the inverter 1301 from the circuit in FIG. 13 and adding a NAND circuit 1501 and an inverter 1502 thereto. Points in which the circuit in FIG. 15 is different from the circuit in FIG. 13 will be explained below.

The NAND circuit 1501 inputs signals of the terminal pwren and a terminal pdctl and outputs a NAND signal thereof. The inverter 1502 logically inverts an output signal of the NAND circuit 1501 and outputs it. The gate of the n-channel transistor 904 is connected to an output terminal of the NAND circuit 1501. The gate of the p-channel transistor 1201 is connected to an output terminal of the inverter 1502.

When the reference potential vss is applied to the terminal pdctl, it becomes possible to realize the power supply detection circuit in FIG. 12 and detect both power-on and power-down. On the other hand, when the power supply potential vdd is applied to the terminal pdctl, it becomes possible to realize the power supply detection circuit in FIG. 13 and detect only power-on.

When the terminal pdctl has the reference potential vss, the NAND circuit 1501 outputs a high irrespective of the voltage of the terminal pwren. The n-channel transistor 904 is turned on since its gate goes high. The p-channel transistor 1201 is turned on since its gate goes low. Namely, the circuit in FIG. 15 becomes the same as the circuit in FIG. 12.

When the terminal pdctl has the power supply potential vdd, the NAND circuit 1501 outputs a logical inversion signal of the signal of the terminal pwren. Namely, the circuit in FIG. 15 becomes the same as the circuit in FIG. 13.

As described above, by applying the reference potential vss to the terminal pdctl, the circuit mode in FIG. 12 can be set, and by applying the power supply potential vdd to the terminal pdctl, the circuit mode in FIG. 13 can be set. The circuit modes can be switched logically by a control signal of the terminal pdctl without changing a metal layer.

A reset circuit includes a power supply detection circuit, a power-down detection circuit, and an output circuit. The power supply detection circuit outputs a first signal when a first voltage according to a power supply voltage is higher than a first threshold and outputting a second signal when the first voltage is lower than the first threshold during power-on and power-down. The power-down detection circuit outputs a third signal when a second voltage according to the power supply voltage becomes lower than a second threshold after the second signal is outputted during power-down. The output circuit outputs a power-on reset signal which changes from low to high when the first signal is outputted during power-on and outputs a power-down reset signal which changes from low to high when the third signal is outputted during power-down.

The reset circuit is obtained by uniting the power-on reset circuit to generate the power-on reset signal and the power-down reset circuit to generate the power-down reset signal. The power supply detection circuit is used both when the power-on reset signal is generated and when the power-down reset signal is generated, whereby the small-sized reset circuit can be realized. Moreover, the power-down detection circuit detects power-down according to the output of a second signal during power-down, which facilitates the timing control of the power-down reset signal during power-down, so that a poor startup when the power is repeatedly turned on/off can be prevented.

The present embodiment is to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A reset circuit, comprising:
   a power supply detection circuit outputting a first signal level when a first voltage according to a power supply voltage is higher than a first threshold and outputting a second signal level when the first voltage is lower than the first threshold during power-on and power-down;
   a power-down detection circuit outputting a third signal level when a second voltage according to the power supply voltage becomes lower than a second threshold after the second signal level is outputted during power-down and maintaining an output of a fourth signal level when the second signal level is output during the power-on; and
   an output circuit outputting a power-on reset signal which changes from low to high when the first signal level is outputted during power-on and signaling power-down reset by changing the power-on reset signal from high to low when the third signal level is outputted during power-down.

2. The reset signal according to claim 1, wherein said power-down detection circuit comprises a diode-connected element and a switch element which are field effect transistors.

3. The reset circuit according to claim 1, wherein a power supply voltage threshold at which the power-down reset signal occurs is lower than a power supply voltage threshold at which the power-on reset signal occurs.

4. The reset circuit according to claim 1, wherein said power-down detection circuit comprises a current limiting element to limit a current in a current path from a power supply potential to a reference potential.

5. The reset circuit according to claim 1, wherein said output circuit comprises a latch circuit.

6. The reset circuit according to claim 1, wherein said power-down detection circuit comprises a Schmitt circuit or an inverter.

7. The reset circuit according to claim 4, wherein the current limiting element is an n-channel field effect transistor to which a gate voltage lower than the power supply voltage is applied.

8. The reset circuit according to claim 7, further comprising:
   a reference voltage generation circuit comprising a diode-connected element which is an n-channel field effect transistor and plural n-channel field effect transistors which are connected in series with the diode-connected element and outputting a reference voltage from between the transistors, wherein the reference voltage is the gate voltage.

9. The reset circuit according to claim 8, wherein the reference voltage is the first voltage.

10. The reset circuit according to claim 2, wherein the diode-connected element of said power-down detection circuit is a diode-connected element which is a p-channel field effect transistor connected to a power supply potential.

11. The reset circuit according to claim 10, wherein said power-down detection circuit comprises a field effect transistor which is connected to the power supply potential and connected in parallel with the diode-connected element.

12. The reset circuit according to claim 2, wherein said power-down detection circuit comprises a capacitor which is connected between the diode-connected element and a reference potential.

13. The reset circuit according to claim 8, wherein said reference voltage generation circuit comprises a diode-connected element which is a p-channel field effect transistor connected to the power supply potential, a diode-connected element which is an n-channel field effect transistor connected to the reference potential, and plural n-channel field effect transistors connected between the two diode-connected elements.

14. The reset circuit according to claim 13, wherein the reference voltage is outputted from between the plural n-channel field effect transistors.

15. The reset circuit according to claim 10, wherein said power-down detection circuit outputs the third signal level when a power supply returns instantaneously from an instantaneous power supply voltage drop.

16. The reset circuit according to claim 2, wherein said power-down detection circuit comprises:
   a diode-connected element which is a p-channel field effect transistor connected to a power supply potential;
   an n-channel field effect transistor which is connected to a reference potential and turned on after the second signal level is outputted; and
   a field effect transistor which is connected between the diode-connected element and the n-channel field effect transistor to limit a current flowing therebetween.

17. The reset circuit according to claim 16, wherein said power-down detection circuit comprises an inverter to input a signal between the diode-connected element and the current limiting field effect transistor and output the third signal level.

18. The reset circuit according to claim 17, wherein the inverter is a Schmitt circuit.

19. The reset circuit according to claim 17, wherein said power-down detection circuit comprises a capacitor which is connected between the diode-connected element and the reference potential.

20. The reset circuit according to claim 19, wherein said output circuit comprises a latch circuit.

21. The reset circuit according to claim 8, wherein said power supply detection circuit comprises:
   an n-channel field effect transistor which is connected between the reference potential and an inverter output terminal and receives the first voltage; and
   a p-channel field effect transistor which is connected between the power supply potential and the inverter output terminal.

22. The reset circuit according to claim 8, wherein when said power supply detection circuit outputs the first signal level, series-connected current paths of the n-channel field effect transistors are cut off.

23. The reset circuit according to claim 1, wherein said power supply detection circuit comprises:
- an n-channel field effect transistor which is connected between a reference potential and an inverter output terminal and receives the first voltage; and
- a p-channel field effect transistor which is connected between a power supply potential and the inverter output terminal, and when said power supply detection circuit outputs the first signal level, a current path of the p-channel field effect transistor is cut off.

24. The reset circuit according to claim 22, further comprising a p-channel field effect transistor whose drain and/or source is connected to an output terminal of the reference voltage.

25. The reset circuit according to claim 22, wherein only when a control signal is inputted, if said power supply detection circuit outputs the first signal level, the series-connected current paths of the n-channel field effect transistors are cut off.

* * * * *